United States Patent [19]

Lutz

[11] Patent Number: 5,442,828
[45] Date of Patent: Aug. 22, 1995

[54] DOUBLE-SIDED WAFER SCRUBBER WITH A WET SUBMERSING SILICON WAFER INDEXER

[75] Inventor: Rick A. Lutz, San Jose, Calif.

[73] Assignee: Ontrak Systems, Inc., Milpitas, Calif.

[21] Appl. No.: 982,830

[22] Filed: Nov. 30, 1992

[51] Int. Cl.⁶ .................... A47L 25/00; B65H 3/08
[52] U.S. Cl. ........................ 15/88.3; 221/79; 221/88; 221/135; 221/278; 221/226; 221/6
[58] Field of Search ............... 221/79, 80, 81, 135, 221/6, 17, 18, 88, 278, 226; 15/88.3

[56] References Cited

U.S. PATENT DOCUMENTS

| | | | |
|---|---|---|---|
| 3,136,697 | 6/1964 | Arnold et al. | 221/79 |
| 3,976,330 | 4/1976 | Babinski et al. | |
| 4,034,869 | 7/1977 | Stange et al. | 221/278 |
| 4,326,643 | 4/1982 | Bayne et al. | 221/278 |
| 4,391,387 | 7/1983 | Bayne et al. | 221/278 |
| 4,874,273 | 10/1989 | Tokisue et al. | 406/88 |

FOREIGN PATENT DOCUMENTS

| | | | |
|---|---|---|---|
| 2635583 | 3/1977 | Germany | 221/278 |
| 0027266 | 1/1977 | Japan | 221/278 |

*Primary Examiner*—H. Grant Skaggs
*Attorney, Agent, or Firm*—Thomas E. Schatzel

[57] ABSTRACT

An embodiment of the present invention is a wet indexer for receiving a cassette of wafers from a previous processing station that have not been allowed to dry. The wet indexer then keeps the wafers submersed in processing solution before and during indexed transmission to later cleaning stations.

8 Claims, 3 Drawing Sheets

DOUBLE-SIDED WAFER SCRUBBER WITH A WET SUBMERSING SILICON WAFER INDEXER

BACKGROUND OF THE INVENTION

1. Field of the Invention

The present invention relates generally to semiconductor fabrication equipment and more specifically to wafer manufacturing, post chemical-mechanical planarization cleaning and particle monitor wafer reclaiming.

2. Description of the Prior Art

Semiconductor processing depends on clean wafers and therefore a clean environment within which to process the wafers. Two methods are conventionally used to obtain clean wafers. A first method includes preventing particulate contamination from occurring, such as doing the wafer processing in a class one hundred cleanroom or a class ten cleanroom. A second method cleans wafers that are dirty, typically with a rinser-dryer. No amount of particulate contamination prevention will keep all wafers clean because some process steps actually generate particulates. Therefore, cleaning of contaminated wafers is almost always necessary.

Double-sided scrubbers, e.g., the OnTrak Systems, Inc. (Milpitas, Calif.) Systems DSS-200 and DSS-150, are directed at applications that require a thorough cleaning of both sides of a wafer. Such systems are being used in semiconductor fabrication (Fab) lines around the world for processes as diverse as bare silicon cleaning by silicon material suppliers to post chemical-mechanical planarization (CMP) for inter-metal dielectric planarization cleaning.

The demand for ever flatter inter-metal dielectrics has increased as semiconductor device geometries continue to shrink. CMP produces a more planar dielectric layer between metal layers by using a silica slurry for a chemical part of the process. If the slurry is not thereafter completely removed, or if it is allowed to dry, so many defects will occur in the individual circuit dice that the whole wafer may have to be scrapped, thus lowering yields and raising unit manufacturing costs.

A conventional double-sided scrubber system has two brush stations that allow for a more thorough cleaning of wafers. A spin station is used to rinse and dry both sides of a wafer without contacting the wafer surfaces. A robot is included that grips cleaned wafers on the edges and places each wafer on a blade that lowers into a wafer cassette. The cassette is positioned on its back to allow a laminar air flow through the cassette. The brushes are constantly flushed with deionized water to inhibit particle buildup. An indexer accepts a cassette of wafers from a previous operation, such as polishing, and will transmit a wafer from the cassette to the cleaning, rinsing and drying stations when appropriate.

SUMMARY OF THE PRESENT INVENTION

It is therefore an object of the present invention to provide a semiconductor processing device that will clean and/or keep clean semiconductor wafers.

It is a further object of the present invention to provide a semiconductor processing device that prevents semiconductor wafers from drying between processing steps.

Briefly, an embodiment of the present invention is a wet indexer for receiving a cassette of wafers from a previous processing station that have not been allowed to dry. The wet indexer then keeps the wafers submersed in processing solution before and during indexed transmission to later cleaning stations.

An advantage of the present invention is that it provides a system that does not allow the wafers received from a previous process step to dry, thus making the job of cleaning easier and more efficient.

These and other objects and advantages of the present invention will no doubt become obvious to those of ordinary skill in the art after having read the following detailed description of the preferred embodiment which is illustrated in the various drawing figures.

IN THE DRAWINGS

DETAILED DESCRIPTION OF THE PREFERRED EMBODIMENTS

Figure 1:
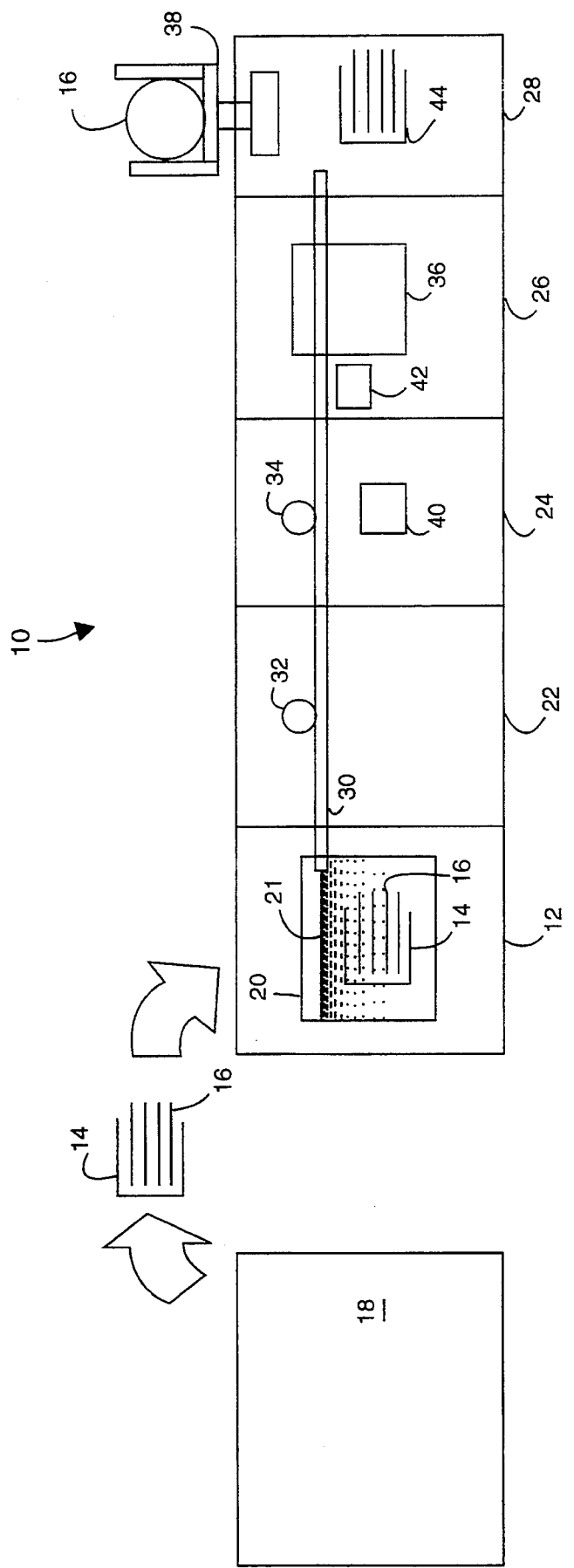
FIG. 1 is a schematic diagram of a double-sided scrubber system with a wet indexer according to the present invention.

FIG. 1 illustrates a double-sided wafer scrubber system 10 comprising a wet indexer 12 for receiving a cassette 14 with a plurality of wafers 16 from a previous processing station 18 and for keeping the wafers 16 submersed in a tank 20 of a process solution 21 before and during indexed transmission to later stations, a pair of brush stations 22 and 24, a spin-dry station 26 and a robotic receiver transfer station 28. Process solution 21 may comprise deionized water, for example. A track 30 draws wafers 16 pass a pair of brushes 32 and 34 to a spinner assembly 36 where a robotic arm 38 lifts each finished wafer 16 out from the station 26. Wafers 16 are typically round, 100 millimeters to 300 millimeters in diameter (e.g., four inches to twelve inches).

Brushes 32 and 34 are direct drive brushes and each of brush stations 22 and 24 has two top and two bottom spray nozzles (not shown) to transport wafers 16 along a wet track 30 and a scrubbing solution spray nozzle (not shown). For more information concerning the transporting of wafers by fluid means, see, U.S. Pat. Nos. 4,874,273, issued to Tokisue, and, 3,976,330, issued to Babinski. The spray nozzles may comprise a non-sticking material, e.g., TEFLON. Track 30 helps keep wafers 16 wet, which makes cleaning of particulates from the wafers easier. The spray nozzles are preferably independently controllable. Brushes 32 and 34 have hollow cores and are supplied with a flow of deionized water during operation for continuous rinsing of the brush bristles. The deionized water is preferably ultra-pure, eighteen megohm. The constant flushing of brushes 32 and 34 serves two purposes. First it prevents particle build-up on the brushes, and second, it keeps the deionized water flowing thereby preventing bacteria growth within the system plumbing. Nylon or PVA may be used for brushes 32 and 34.

Preferably, the process solution (e.g., deionized water) flows as long as power is being applied to system 10. Brush station 24 includes an optical wafer-flat sensor 40 to properly align wafers 16 for spin-dry station 26. The sensor 40 helps minimize vibration which, in turn, minimizes particulate generation due to the wafer flat being misaligned. A reflective sensor 42 is included in spin-dry station 26 to identify when a wafer 16 enters. After a wafer 16 stops along track 30 within spin-dry station 26, spinner assembly 36 rises to pickup the wafer. Preferably, the plumbing of station 26 allows for both top and bottom rinse lines. An open four-finger nest assembly 41 allows deionized water to contact both sides of wafers 16. The tops and bottoms are conventionally dried simultaneously by spinning. Preferably, counter balances are included on the nest assembly 41 to prevent opening of the fingers during spinning. After spinning, wafers 16 are raised for transfer by robotic arm 38.

Robotic arm 38 grips wafers 16 at three points around the outside edge and places the clean, dry wafer on a blade that lowers the wafers 16 into a receiver cassette 44. The receiver cassette is preferably horizontally positioned to allow the wafers 16 to be lowered into their respective slots. A laminar air flow is directed continually through cassette 44.

Figure 2B:
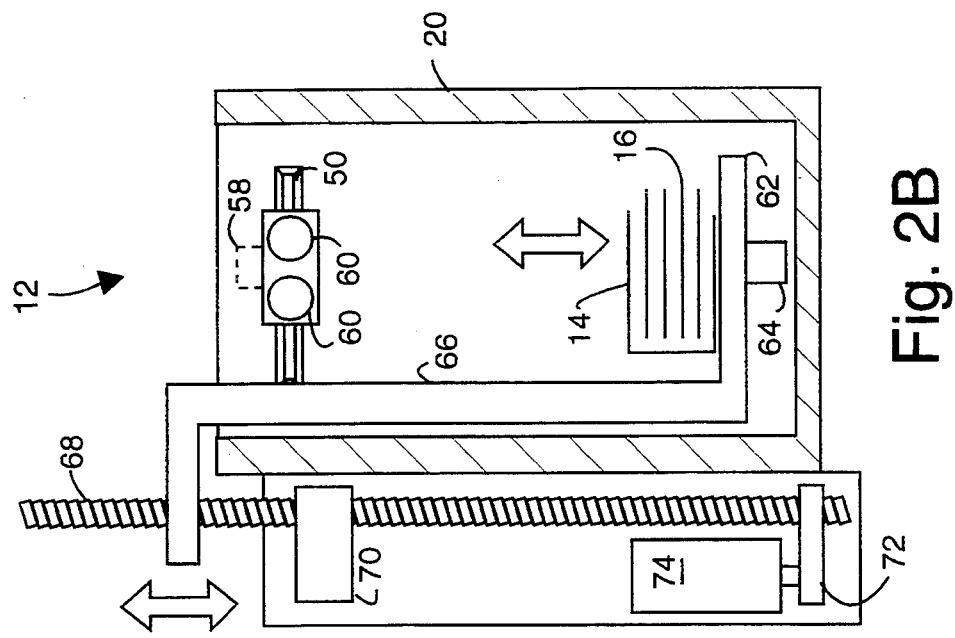
FIG. 2B is a cross-sectional view of one side of the wet indexer of the system of FIG. 1.
Figure 2A:
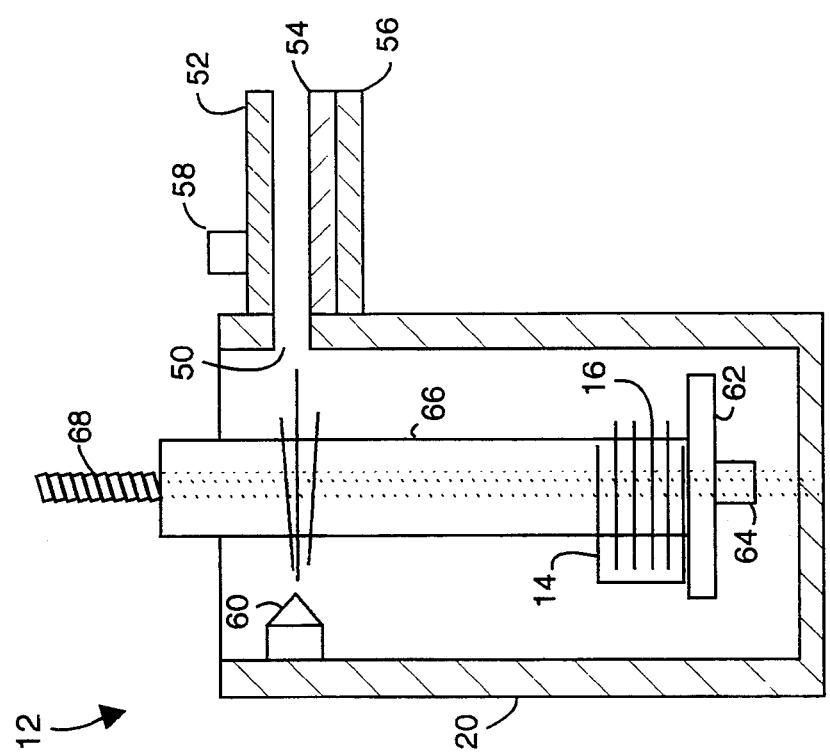
FIG. 2A is a cross-sectional view of the front of the wet indexer of the system of FIG. 1.
Figure 3:
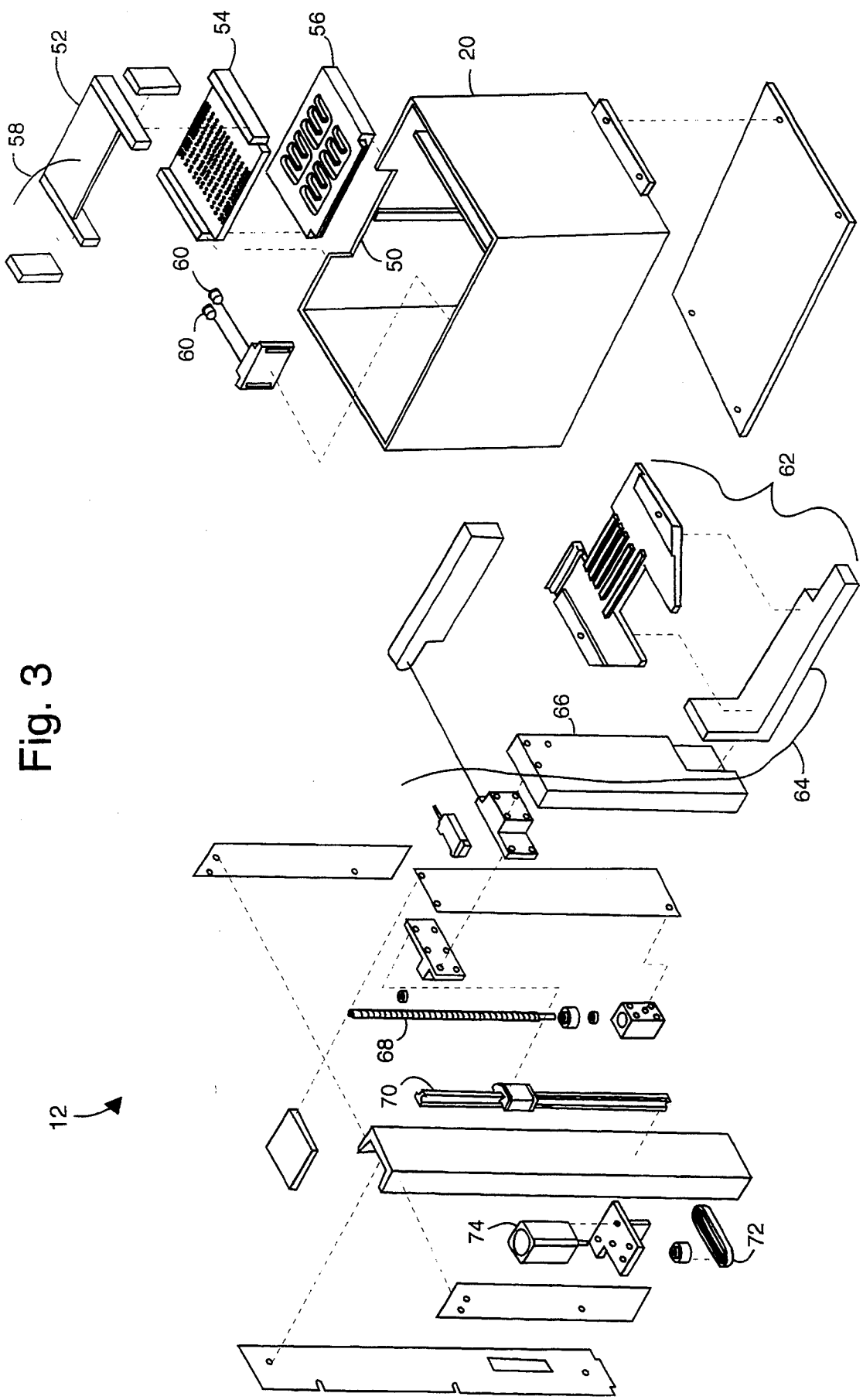
FIG. 3 is a perspective exploded assembly view of the wet indexer of the system of FIG. 1.

FIGS. 2A, 2B and 3 illustrate wet indexer 12, which comprises the tank 20, a wafer outlet 50, a cover 52, a bottom wafer guide 54, a manifold 56, a wafer-present optical sensor 58, a pair of nozzles 60, a cassette platform 62, a cassette-present optical sensor 64, a lift arm 66, a lead screw 68, a support block 70, a belt drive 72 and a stepper motor 74. Tank 20 is filled with a processing solution 21, such as water (shown in FIG. 1 only for clarity). Wet indexer 12 is constructed such that wafers 16 are not contacted when dry by belts that are typical of the prior art and that can leave skid residues on the surface of the wafer thus contacted. Bottom wafer guide 54 is therefore a non-wafer-contacting element. The elements of wet indexer 12 that can come in contact with the processing solution 21 are preferably comprised of non-metallic materials or have non-metallic coatings on at least the surfaces that can come in contact with the processing solution 21. Such a use of non-metallic materials is for preventing a contamination of wafers 16 with ions of the respective metals involved.

In operation, a user places cassette 14 (FIGS. 2A and 2B) on platform 62 which is in a raised position nearly level with outlet 50. Sensor 64 detects that cassette 14 is present and stepper motor turns lead-screw 68 to lower arm 66 and platform 62 to submerse wafers 16 in processing solution 21. When a wafer 16 is needed in station 22 (FIG. 1), stepper motor turns lead-screw 68 to raise arm 66 and platform 62 such that a wafer 16 is aligned with outlet 50. Deionized water is sprayed from nozzles 60 to move wafer 16 through outlet 50 and between guides 52 and 54. If sensor 58 does not detect a wafer 16 at an appropriate time point, the flow of water from nozzles 60 is preferably inhibited to prevent damage to brush 32 (FIG. 1). Processing solution 21 acts as a pre-soak and prevents drying of wafers 16 while they are queued up for cleaning. All components or surfaces of components within wet indexer 12 that come within contact of processing solution 21 are preferably comprised of non-metals, e.g., plastics, PVA, and TEFLON. Nozzles 60 are preferably comprised of a material that produces a non-diffused spray. Sensor 64 includes fiber optic cable that is routed up and out of tank 20 along arm 66 to an LED and light detector that remain dry. Manifold 56 is supplied a flow of deionized water that tends to float any wafers 16 passing above in guides 52 and 54.

A process embodiment of the present invention includes the steps of preventing the drying of wafers delivered to a wafer cleaning system and indexing the wafers for cleaning from a queue submersed in a volume of process solution, such as deionized water. In FIG. 1, a boat filled with process solution is preferably used when transporting wafers 16 and cassette 14 between previous processing station 18 and indexer 12 to prevent drying of wafers 16. By not allowing the wafers to dry before cleaning, subsequent cleaning steps are improved because the otherwise unavoidable bonds between particles and the waters are prevented or inhibited. Small diameter particles, which can form particularly high energy adhesion bonds, are therefore not able to become a source of trouble the later cleaning stages. Problems with small particulates generated in previous fabrication processes that have not yet bonded to the wafers are thereby avoided.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A wet indexer, comprising:
   a tank for holding a processing solution and for accepting a cassette of wafers from a previous processing station and for pre-soaking said wafers in said processing solution while said wafers are in a queue waiting for transfer to a subsequent stage;
   wafer outlet means in a side of the tank for a non-contacting passing of individual said wafers out of the tank; and
   liquid jet means for motivating individual said wafers to pass from said cassette and out through the wafer outlet means.

2. The indexer of claim 1, further comprising:
   wafer-present sensor means for detecting individual said wafers passing through the wafer outlet means wherein the liquid jet means may be operated appropriately to motivate said individual wafers.

3. The indexer of claim 1, further comprising:
   cassette platform and platform elevation means for holding and indexing said cassette of wafers and for submerging said cassette of wafers in said processing solution and for lifting said cassette of wafers out of said cassette of wafers out of said processing solution.

4. The indexer of claim 3, further comprising:
   a cassette-present sensor for detecting whether or not said cassette of wafers is being held by the cassette platform and platform elevation means wherein operation of the cassette platform and platform elevation means may be disabled if a cassette is not present.

5. The indexer of claim 3, wherein the cassette platform and platform elevation means comprises:
   a lift arm;
   a lead screw attached to the lift arm; and
   a stepper motor coupled to the lead-screw for moving said cassette of wafers up and down within the tank.

6. The indexer of claim 1, wherein the wafer outlet means comprises:
   a non-wafer-contacting wafer guide;
   a manifold for floating of said wafers passing through the wafer guide with a processing solution such that the liquid jet means moves said individual wafers out through the wafer guide.

7. A wafer cleaner system including a plurality of stations, comprising:

a wet indexer for receiving a cassette of wafers from a previous processing station and for keeping the wafers submersed in a tank of processing solution before and during an indexed transmission to a next station, the wet indexer including processing solution jet means for extracting said wafers from said cassette and for moving said wafers thus extracted to said next station;

a first wafer brushing station for receiving said wafers from the wet indexer and for cleaning said wafers on both sides with processing solution;

a second wafer brushing station for receiving wafers from the first brushing station and for cleaning said wafers on both sides with processing solution;

a wafer spin-dry station for receiving said wafers from the second brushing station and including spinning means for spin-drying said wafers; and a robotic receiver transfer station for receiving said wafers from the wafer spin-dry station and for placing said wafers in a cassette.

8. The system of claim 7, wherein:

the wet indexer includes cassette-present detection means for enabling a lowering said cassette into said tank of processing solution only when, a cassette is present;

said processing solution jet means comprises liquid jet nozzles and wafer-present detection means to shut-off a flow of processing solution through said nozzles when a wafer is not present; and the second wafer brushing station includes an optical wafer-flat sensor to properly align said wafers for the wafer spin-dry station.

* * * * *